(12) United States Patent
Gao et al.

(10) Patent No.: US 6,963,392 B1
(45) Date of Patent: Nov. 8, 2005

(54) IMAGE-FORMING DEVICE HAVING A BELT TYPE PROCESSING MEMBER WITH MICRO-FEATURES

(75) Inventors: Zhanjun Gao, Rochester, NY (US); Alphonse D. Camp, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/851,886

(22) Filed: May 21, 2004

(51) Int. Cl.$^7$ .............................................. G03B 27/00
(52) U.S. Cl. ....................... 355/400; 355/402; 355/406
(58) Field of Search ................................ 355/400–408

(56) References Cited

U.S. PATENT DOCUMENTS

| | | | |
|---|---|---|---|
| 4,772,530 A | 9/1988 | Gottschalk et al. | |
| 4,772,541 A | 9/1988 | Gottschalk et al. | |
| 4,800,149 A | 1/1989 | Gottschalk et al. | |
| 4,809,599 A * | 3/1989 | Kawada et al. | 100/176 |
| 4,842,980 A | 6/1989 | Gottschalk et al. | |
| 4,865,942 A | 9/1989 | Gottschalk et al. | |
| 4,914,463 A * | 4/1990 | Yui et al. | 396/584 |
| 5,057,393 A | 10/1991 | Shanklin et al. | |
| 5,100,755 A | 3/1992 | Shanklin | |
| 5,783,353 A | 7/1998 | Camillus et al. | |
| 5,884,114 A | 3/1999 | Iwasaki | |
| 6,229,558 B1 | 5/2001 | Saigo et al. | |
| 6,483,575 B1 | 11/2002 | Allen et al. | |
| 2002/0045121 A1 | 4/2002 | Higuchi et al. | |

* cited by examiner

Primary Examiner—Judy Nguyen
Assistant Examiner—Kevin Gutierrez
(74) Attorney, Agent, or Firm—David A. Novais

(57) ABSTRACT

An image-forming device comprises a rotating belt that includes a plurality of micro-members. The micro-members are preferably spherical members or hook and loop members. The rotating belt having the micro-members thereon is adapted to contact microencapsulated media with a force sufficient to rupture unhardened microcapsules on the media.

12 Claims, 11 Drawing Sheets

IMAGE-FORMING DEVICE HAVING A BELT TYPE PROCESSING MEMBER WITH MICRO-FEATURES

CROSS REFERENCE TO RELATED APPLICATIONS

The present application is related to the following pending patent application: U.S. patent application Ser. No. 10/831,085 filed Apr. 23, 2004, entitled ROLLER CHAIN FOR APPLYING PRESSURE.

FIELD OF THE INVENTION

The present invention relates to an image-forming device for processing photosensitive media, wherein the photosensitive media includes a plurality of microcapsules that encapsulate imaging material such as coloring material.

BACKGROUND OF THE INVENTION

Image-forming devices are known in which media having a layer of microcapsules containing a chromogenic material and a photohardenable or photosoftenable composition, and a developer, which may be in the same or a separate layer from the microcapsules, is image-wise exposed. In these devices, the microcapsules are ruptured, and an image is produced by the differential reaction of the chromogenic material and the developer. More specifically, in these image-forming devices, after exposure and rupture of the microcapsules, the ruptured microcapsules release a color-forming agent, whereupon the developer material reacts with the color-forming agent to form an image. The image formed can be viewed through a transparent support or a protective overcoat against a reflective white support as is taught in, for example, U.S. Pat. No. 5,783,353 and U.S. Publication No. 2002/0045121 A1. Typically, the microcapsules will include three sets of microcapsules sensitive respectively to red, green and blue light and containing cyan, magenta and yellow color formers, respectively, as taught in U.S. Pat. No. 4,772,541. Preferably a direct digital transmission imaging technique is employed using a modulated LED print head to expose the microcapsules.

Conventional arrangements for developing the image formed by exposure in these image-forming devices include using spring-loaded balls, micro wheels, micro rollers or rolling pins, and heat from a heat source is applied after this development step to accelerate development.

The photohardenable composition in at least one and possibly all three sets of microcapsules can be sensitized by a photo-initiator such as a cationic dye-borate complex as described in, for example, U.S. Pat. Nos. 4,772,541; 4,772,530; 4,800,149; 4,842,980; 4,865,942; 5,057,393; 5,100,755 and 5,783,353.

The above describes micro-encapsulation technology that combines micro-encapsulation with photo polymerization into a photographic coating to produce a continuous tone, digital imaging member. With regard to the media used in this technology, a substrate is coated with millions of light sensitive microcapsules, which contain either cyan, magenta or yellow image forming dyes (in leuco form). The microcapsule further comprises a monomer and the appropriate cyan, magenta or yellow photo initiator that absorb red, green or blue light respectively. Exposure to light, after the induction period is reached, induces polymerization.

When exposure is made, the photo-initiator absorbs light and initiates a polymerization reaction, converting the internal fluid (monomer) into polymer, which binds or traps leucodye from escaping when pressure is applied.

With no exposure, microcapsules remain soft and are easily broken, permitting all of the contained dye to be expelled into a developer containing binder and developed which produces the maximum color available. With increasing exposure, an analog or continuous tone response occurs until the microcapsules are completely hardened, to thereby prevent any dye from escaping when pressure is applied.

Conventionally, as describe above, in order to develop the image, pressure is uniformly applied across the image. As a final fixing step, heat is applied to accelerate color development and to react all un-reacted liquid from the microcapsules. This heating step also serves to assist in the development of available leucodye for improved image stability. Generally, pressure ruptured capsules (unhardened) expel luecodye into the developer matrix.

Small compact low cost printers typically employed micro-wheels or balls backed by springs and operate in a scanning stylus fashion by transversing the media. This allowed for low cost and relatively low spring force due to the small surface area that the ball or micro wheel (typically 2 to 3 mm diameter) contacted on the media. The disadvantage of this method was that the processing pitch required to assure uniform development needs to be (approximately 1 mm for a 3/16" diameter ball) which results in slow processing times for a typical print image format (4×6 inch). Ganging multiple ball stylus or micro wheels adds cost, and increases the possibility of processing failure due to debris caught under a ball surface.

Conventional high speed processing involved line processing utilizing large crushing rollers. To ensure the high pressure, (psi) required, these rollers tended to be large to minimize deflection. However, these large rollers were costly, heavy, and require high spring loading. Also, the extensibility of this method is limited as larger rollers (and spring loads) are required as media size increases.

Recent developments in media design (or the imaging member) as described in co-pending U.S. application Ser. No. 10/687,939 have changed the prior art structure of the imaging member to the point where the aforementioned means of processing may no longer be robust. The use of a substantially non-compressible top clear polymer film layer and a rigid opaque backing layer which serves to contain the image forming layer of conventional media presented a processing position whereby balls, micro wheels or rollers could be used without processing artifacts such as scratch, banding, or dimensional or surface deformation. In addition, the non-compressibility of this prior art structure provided more tolerance to processing conditions. The recent imaging member embodiment as described in the above-mentioned co-pending patent application, replaces the top and bottom structures of the media with highly elastic and compressible materials (gel SOC) (super over coat or top most clear gel comprising layer) and synthetic paper (polyolefin). The media as described in the above-mentioned co-pending application may no longer survive these means of processing in a robust fashion where pressure is applied by a roller or ball. This is due to the fact that in the imaging member described in the co-pending application, the polyolefin paper backing that is used as fiber base substrates (cellulose fiber) present non uniform density, and the high compression forces required for processing in the conventional arrangements may make an "image" of the fiber pattern in the print, thus making the print corrupt.

It would be advantageous to provide a means or method of processing that did not invoke present methods utilizing high compression forces, to provide a high quality image by improving the tonal scale development and density minimum formation of the imaging member. As mentioned, the need to provide a means of processing that will facilitate the use of the recently designed imaging member is needed. In addition, a processing means that would use plain paper as a substrate would be highly desired. Further, it would be advantageous to provide a means of processing that is low in cost, is fully extensible, and is mechanically simple and robust.

SUMMARY OF THE INVENTION

The present invention provides for an image-forming device and method that addresses the issues noted above. The image-forming device of the present invention offers the advantages of both types of prior art, i.e., low spring load and fast printing speed.

In a preferred embodiment of the present invention the mechanism for crushing the microcapsules is comprised of a belt or belt-type member with micro-members on a surface thereof, and a platen roller that opposes the belt. The micro-members on the belt can define spherical features that are in direct contact with an emulsion side of the media to introduce pressure which is sufficient to rupture unhardened microcapsules on the media.

The present invention therefore relates to an image-forming device which comprises an imaging member adapted to expose a photosensitive medium to form a latent image on the photosensitive medium, with the photosensitive medium comprising a plurality of microcapsules which encapsulate imaging material; and a processing member adapted to develop the latent image, with the processing member comprising a rotatable belt that includes micro-members on a surface thereof which contact the photosensitive medium during a rotation of the belt to apply a force to a surface of the photosensitive medium. The force is sufficient to release imaging material from selected microcapsules of the plurality of microcapsules.

The present invention also relates to an image forming method that comprises exposing a photosensitive medium comprising a plurality of micro-capsules which encapsulate imaging material to form a latent image; and developing the latent image by contacting a surface of said medium with a rotating belt having micro-members thereon, with the contacting of the micro-members of the rotating belt with the surface of the medium applying a force to the surface of the medium which is sufficient to release imaging material from selected microcapsules of the plurality of microcapsules.

DETAILED DESCRIPTION OF THE INVENTION

Figure 1A:
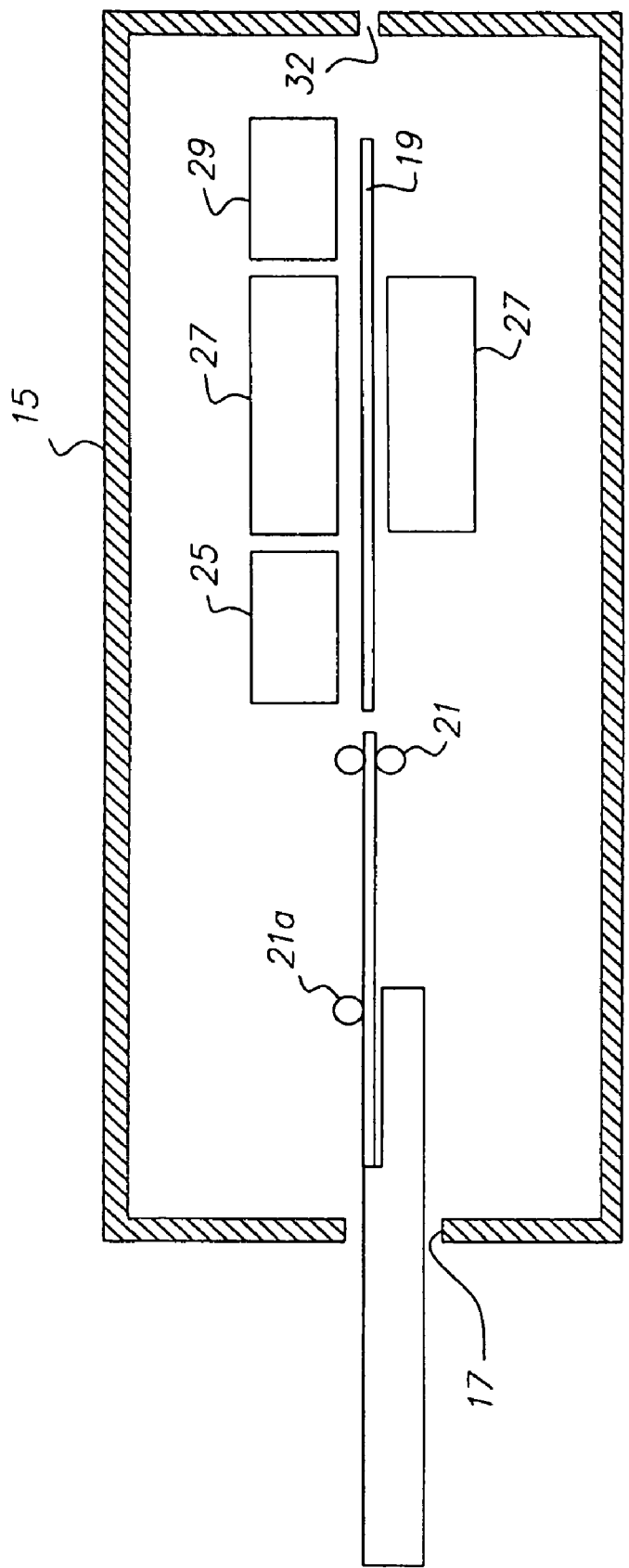
FIG. 1A schematically shows an image-forming device.

Referring now to the drawings, wherein like reference numerals represent identical or corresponding parts throughout the several views, FIG. 1A is a schematic view of an image-forming device 15 pertinent to the present invention. Image-forming device 15 could be, for example, a printer that includes an opening 17 that is adapted to receive a cartridge containing photosensitive media. As described in U.S. Pat. No. 5,884,114, the cartridge could be a light tight cartridge in which photosensitive sheets are piled one on top of each other. When inserted into image-forming device 15, a feed mechanism that includes, for example, a feed roller 21a in image-forming device 15, working in combination with a mechanism in the cartridge, cooperate with each other to pull one sheet at a time from the cartridge into image-forming device 15 in a known manner. Although a cartridge type arrangement is shown, the present invention is not limited thereto. It is recognized that other methods of introducing media into to the image-forming device such as, for example, individual media feed or roll feed are applicable to the present invention.

Once inside image-forming device 15, photosensitive media travels along media path 19, and is transported by, for example, drive rollers 21 connected to, for example, a driving mechanism such as a motor. The photosensitive media will pass by an imaging member 25 in the form of an imaging head that could include a plurality of light emitting elements (LEDs) that are effective to expose a latent image on the photosensitive media based on image information. After the latent image is formed, the photosensitive media is conveyed past a processing assembly or a development member 27. Processing assembly 27 could be a pressure applicator or pressure assembly, wherein an image such as a color image is formed based on the image information by applying pressure to microcapsules having imaging material encapsulated therein to crush unhardened microcapsules. As discussed above, the pressure could be applied by way of spring-loaded balls, micro wheels, micro rollers, rolling pins, etc.

Figure 1B:
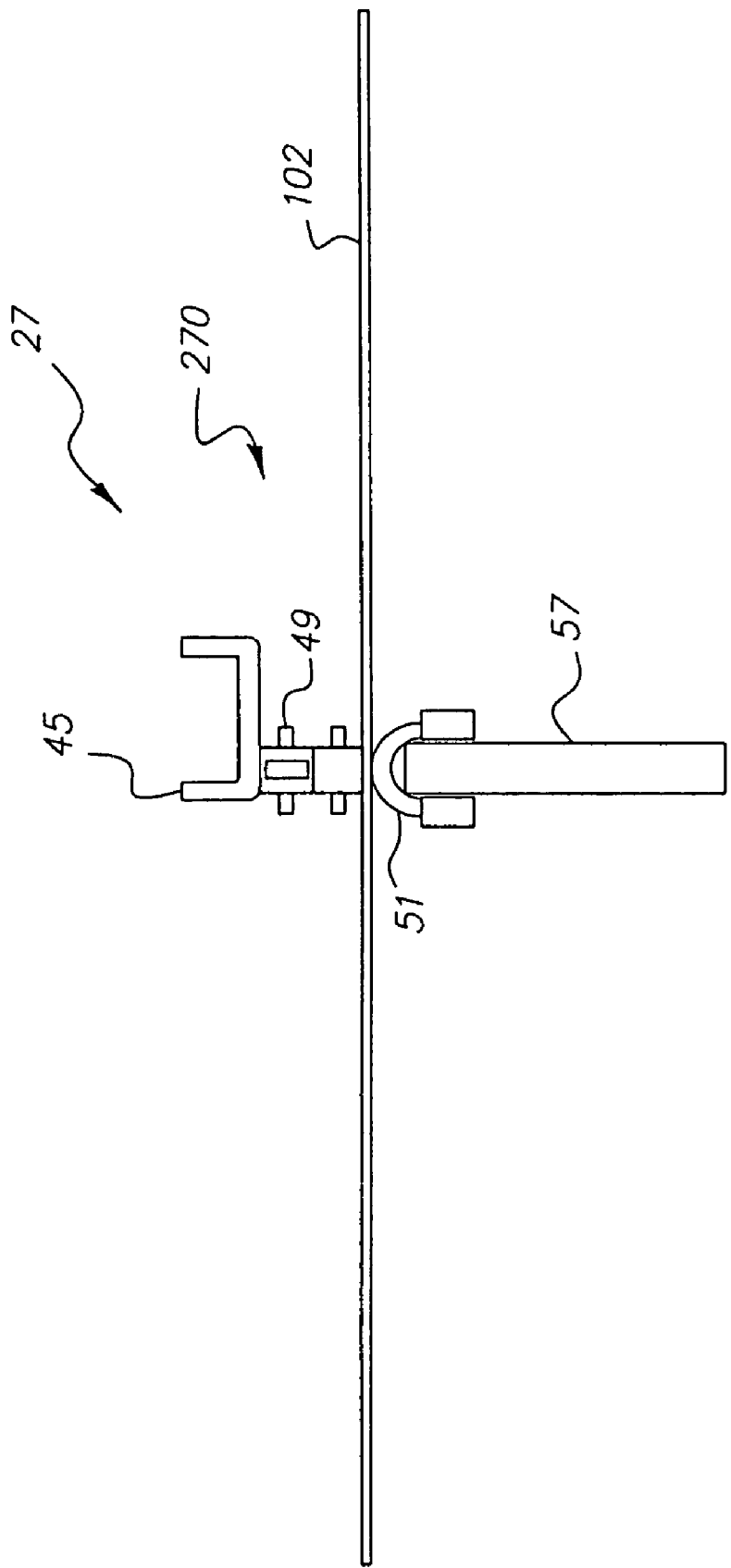
FIG. 1B schematically shows an example of a pressure applying system that can be used in the image-forming device of FIG. 1A.

FIG. 1B schematically illustrates an example of a pressure applicator 270 for processing assembly 27 which can be used in the image-forming device of FIG. 1A. In the example of FIG. 1B, pressure applicator 270 is a crushing roller arrangement that provides a point contact on photosensitive medium 102. More specifically, pressure applicator 270 includes a support 45 that extends along a width-wise direction of photosensitive medium 102. Moveably mounted on support 45 is a crushing roller arrangement 49 that is adapted to move along the length of support 45, i.e., across the width of photosensitive medium 102. Crushing roller arrangement 49 is adapted to contact one side of photosensitive medium 102. A beam or roller type member 51 is positioned on an opposite side of photosensitive medium 102 and can be provided on a support or spring member 57. Beam or roller type member 51 is positioned so as to contact the opposite side of photosensitive medium 102 and is located opposite crushing roller arrangement 49. Beam or roller type member 51 and crushing roller arrangement 49 when in contact with photosensitive medium 102 on opposite sides provide a point contact on photosensitive medium 102. Crushing roller arrangement 49 is adapted to move along a width-wise direction of photosensitive material 102 so as to crush unhardened microcapsules and release coloring material. Further examples of pressure applicators or crushing members that can be used in the image-forming device of FIG. 1A are described in U.S. Pat. Nos. 6,483,575 and 6,229,558.

Within the context of the present invention, the imaging material comprises a coloring material (which is used to form images) or material for black and white media. After the formation of the image, the photosensitive media is conveyed past heater 29 (FIG. 1A) for fixing the image on the media. In a through-feed unit, the photosensitive media could thereafter be withdrawn through an exit 32. As a further option, image-forming device 15 can be a return unit in which the photosensitive media is conveyed or returned back to opening 17.

As previously discussed, conventional arrangements employ spring loaded micro-wheels or ball processing (point processing) to provide a pressure or crushing force to microcapsules of microencapsulated media. The traditional approach for crushing the microcapsules by way of a crushing force applied by balls, wheels or micro-rollers may provide for processing speeds which are in some instances not as fast as desired due to the fact that the development pitch of these arrangements are small, and processing velocity is limited to reasonable bi-directional travel rates. Furthermore, in the traditional ball-crushing arrangements, debris introduced into the printer can cause the ball or micro-wheel to drag the debris over the media to cause a scratching of the image and, thus, render the print unusable.

In order to provide for a higher throughput device, large rollers, which have a width that covers the width of the media, can be utilized. However, these large rollers tend to require high spring loading and may deflect under load. This could adversely affect the application of pressure on the media.

Figure 2:
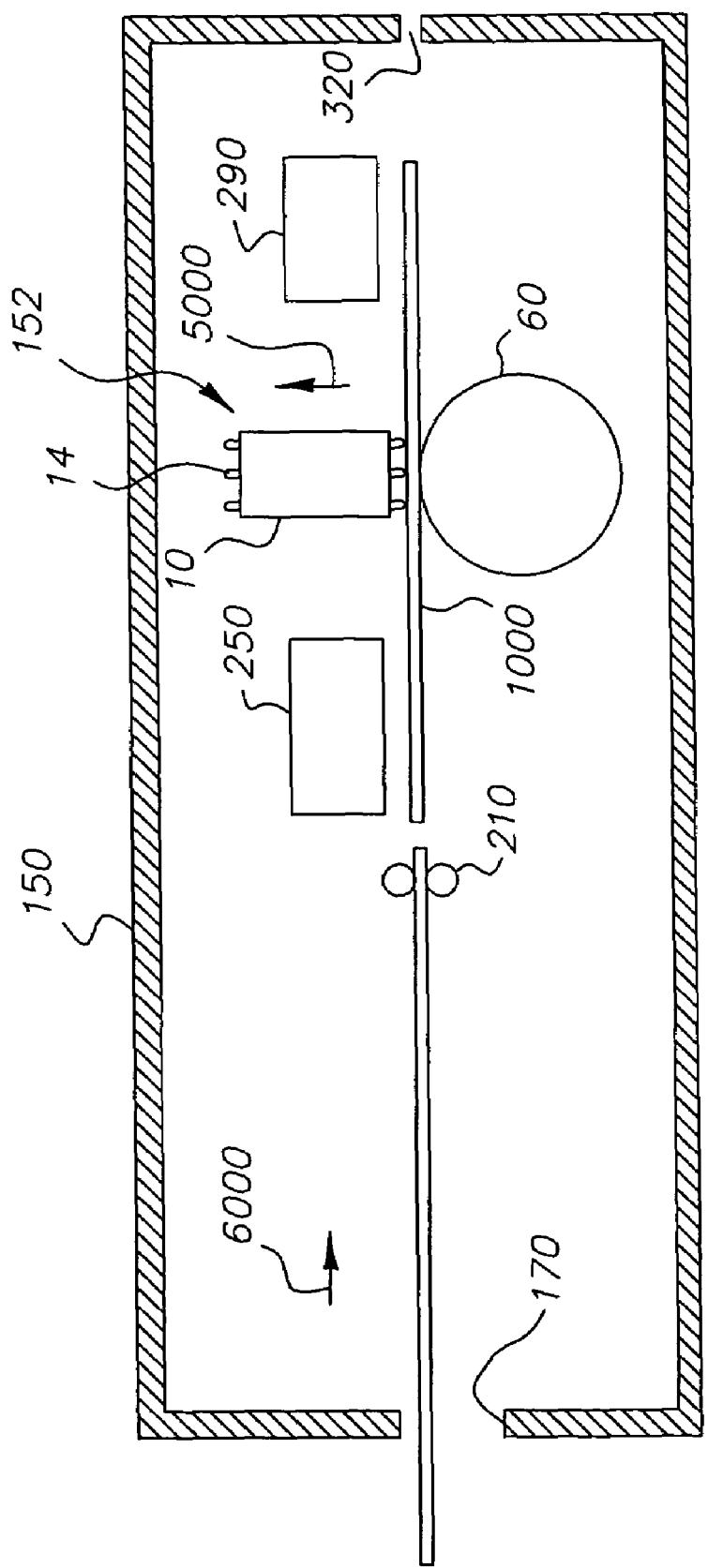
FIG. 2 schematically shows an image-forming device in accordance with the present invention.

The present invention overcomes the above-noted drawbacks by providing for an image-forming device 150 as shown in FIG. 2. Image-forming device 150 is similar to image-forming device 15 in FIG. 1A except for the processing member. More specifically, image-forming device 150 can be adapted to accept microencapsulated media through an opening 170, while a roller 210 can be adapted to convey the media to an imaging member 250. Imaging member 250 can be an imaging head that includes a plurality of light-emitting elements adapted to expose a latent image on the media based on image information. After the latent image is formed, the media is conveyed passed a processing assembly or a development member 152 in accordance with the present invention. Development member 152 comprises a belt or belt type processing member 10 and a backing member 60, which can be an opposing platen roller, an opposing beam or a surface having a width that generally matches the width of the media. Belt 10 comprises micro-members 14 thereon that are adapted to contact microencapsulated photosensitive medium 1000 when it travels between belt 10 and backing member 60. More specifically, belt 10 includes a surface or outer surface that comprises a plurality of micro-members 14 which contact the surface of media 1000 as belt 10 is rotated. Micro-members 10 can define spherical features or can be in the form of hook-like or loop-like members provided on the exterior surface of belt 10.

Figure 3:
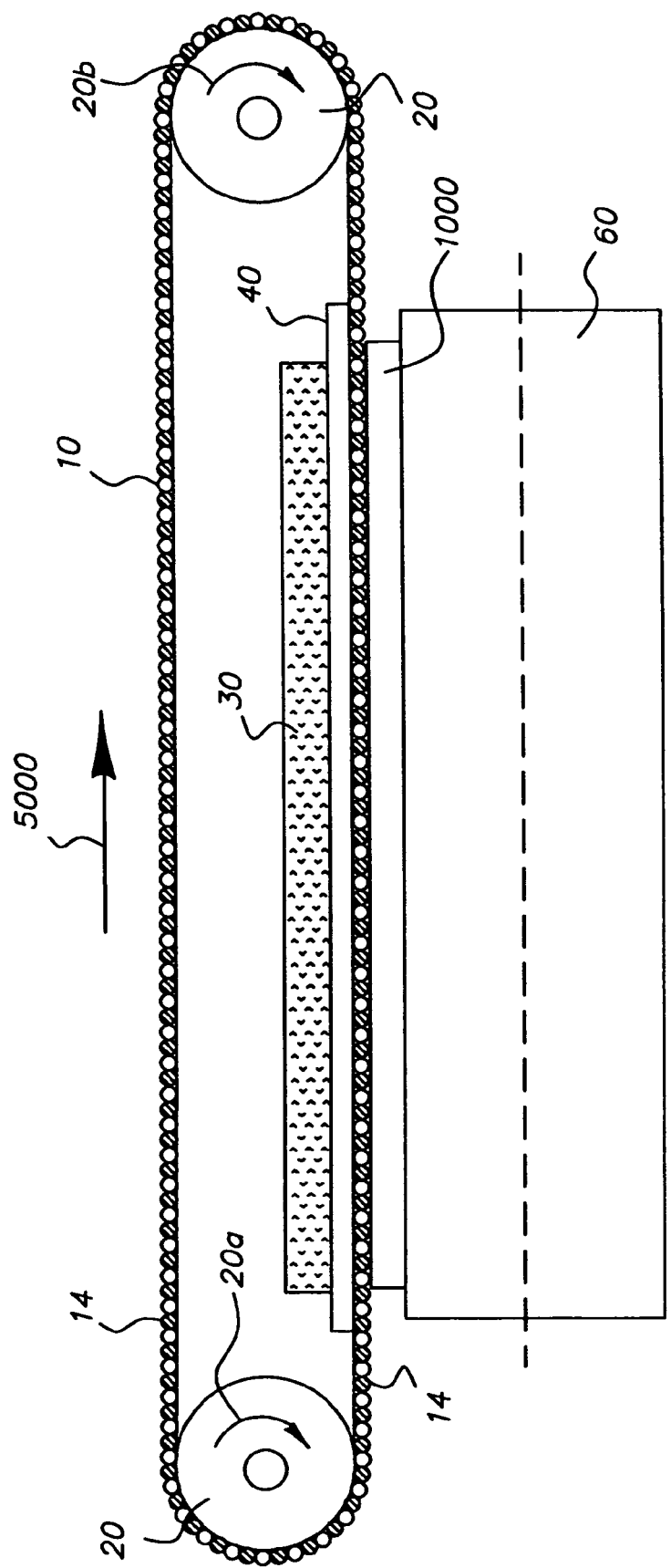
FIG. 3 is a front or rear view of a belt or belt-type processing member in accordance with the present invention.

FIG. 3 is a view of the front or rear of belt 10 relative to media 1000 wherein media 1000 is traveling into or from the paper. As illustrated in FIG. 3, belt 10 is preferably an endless belt that is wrapped around opposing pulleys 20. A known drive member such as a motor can be used to rotate pulleys 20 as shown by the arrows 20*a*, 20*b* to cause a rotation of belt 10 in direction 5000. As shown in FIG. 2, the rotation direction 5000 of belt 10 is transverse to the direction of travel 6000 of media 1000 in image-forming device 150.

As further illustrated in FIG. 3, a spring-loaded plate 40 urged by springs 30 can be provided on a surface of belt 10. Preferably, spring-loaded plate 40 is provided within endless belt 10 and on a portion of belt 10 that faces media 1000 to provide a pressure on belt 10 that is applied to media 1000.

For processing media 1000, belt 10 is rotated in direction 5000 or a direction opposite to direction 5000, such that micro-members 14 contact media 1000 with a rotational force that is sufficient to apply a shear-like force and/or a compressional force onto the top surface of media 1000. With this arrangement, the rotational force applied by micro-members 14 is essentially converted to a compressive or pressure force onto media 1000, which is sufficient to rupture selected unhardened microcapsules.

Figure 4:
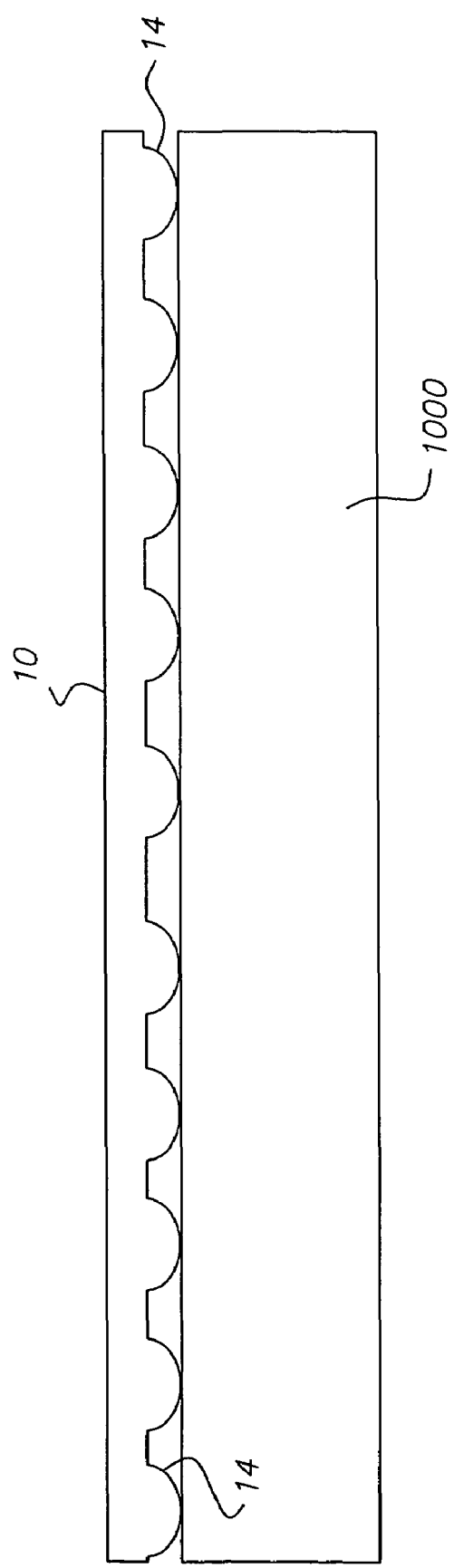
FIG. 4 is a detailed view of one embodiment of the belt or belt-type processing member in accordance with the present invention.
Figure 5:
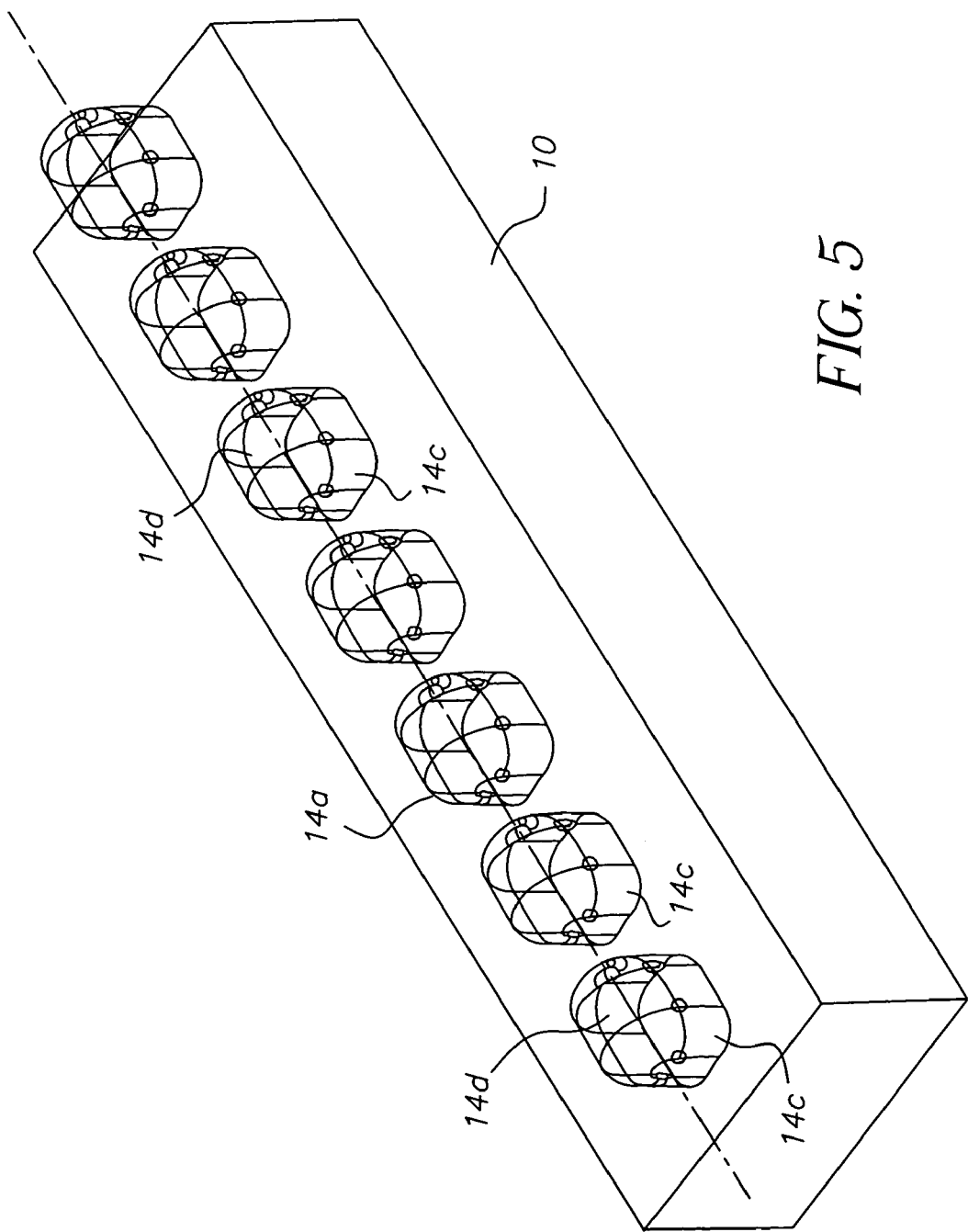
FIG. 5 is a schematic view of the surface of an embodiment of the belt or belt-type processing member in accordance with the present invention.

FIG. 4 is a detailed view of a section of belt 10 having micro-members 14 thereon. As shown, belt 10 is located such that the micro-members 14 contact a surface of media 1000. Therefore, when belt 10 is rotated as described above, the micro-members 14 apply a force on the media that is sufficient to rupture unhardened microcapsules on media 1000. As also shown in FIG. 4, micro-members 14 could be in the form of spherical members such as semi-circles. Of course, the present invention is not limited to the spherical members being in the form of semi-circles provided directly on the surface of belt 10. For example, as shown in FIG. 5, the micro-members could be designed to rise above a surface of belt 10. More specifically, micro-members 14*a* as shown in FIG. 5 include a base section 14*c* and a semicircular member 14*d* that can be made of any smooth surface and can take any shape. With the arrangement of FIG. 5 in which the semicircular member 14*d* is raised from the belt surface, it is not necessary to locate belt 10 as close to the surface of media 1000 as in the embodiment of FIG. 4.

Figure 6:
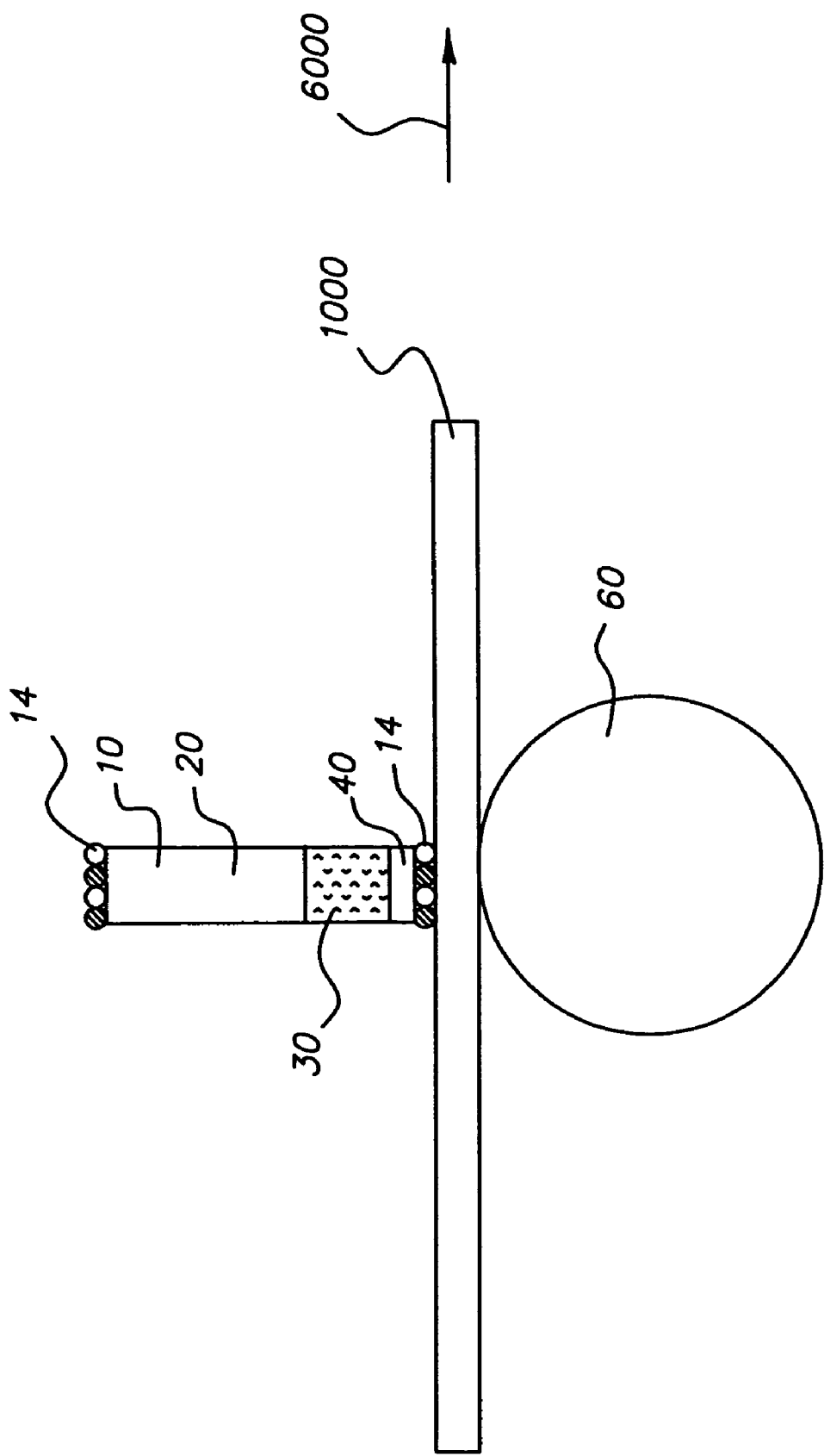
FIG. 6 is a side view of the belt or belt-type processing member of FIG. 3.

FIG. 6 is a side view of a portion of the image-forming device in accordance with the present invention and illustrates belt 10 with respect to media 1000. As shown, media 1000 travels in direction 6000 while belt 10 is rotated in direction 5000 (FIG. 3) which would be a direction in and out of the paper in FIG. 6 and is transverse to direction 6000. Spring loaded plate 40 with springs 30 urge micro-members 14 into contact with media 1000 such that nips are essentially formed between each of micro-members 14 and backing member 60 for the passage of media 1000 therebetween.

Referring back to FIG. 3 where belt 10 is shown as moving from left to right, while media 1000 is moving out of the plane and perpendicular to the belt moving direction, belt 10 preferably defines a width between pulleys 20*a*, 20*b* that is at least greater than a width of media 1000. Therefore, rotation of belt 10 having micro-members 14 thereon is effective to crush all the unhardened microcapsules and release imaging material to form an image. The imaging material that is released from the microcapsules comprises a coloring material that is used to form the image or material for black and white media. After formation of the image, the photosensitive media is conveyed pass heater 290 for fixing the image on the media. In a through-feed unit, the photosensitive media could thereafter be withdrawn through an exit 320. As a further option, image-forming device 150 can be a return unit in which the photosensitive media is conveyed to or returned back to opening 170.

Figure 7B:
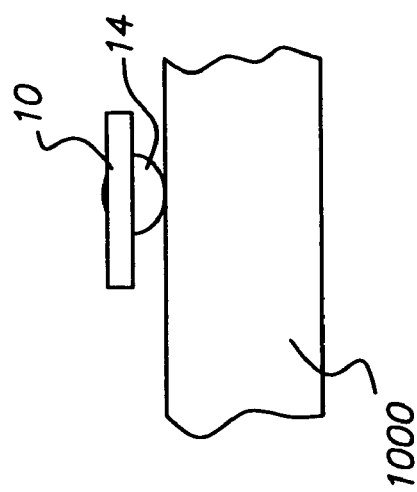
FIGS. 7A and 7B illustrate features of the belt or belt-type processing member of the present invention.
Figure 7A:
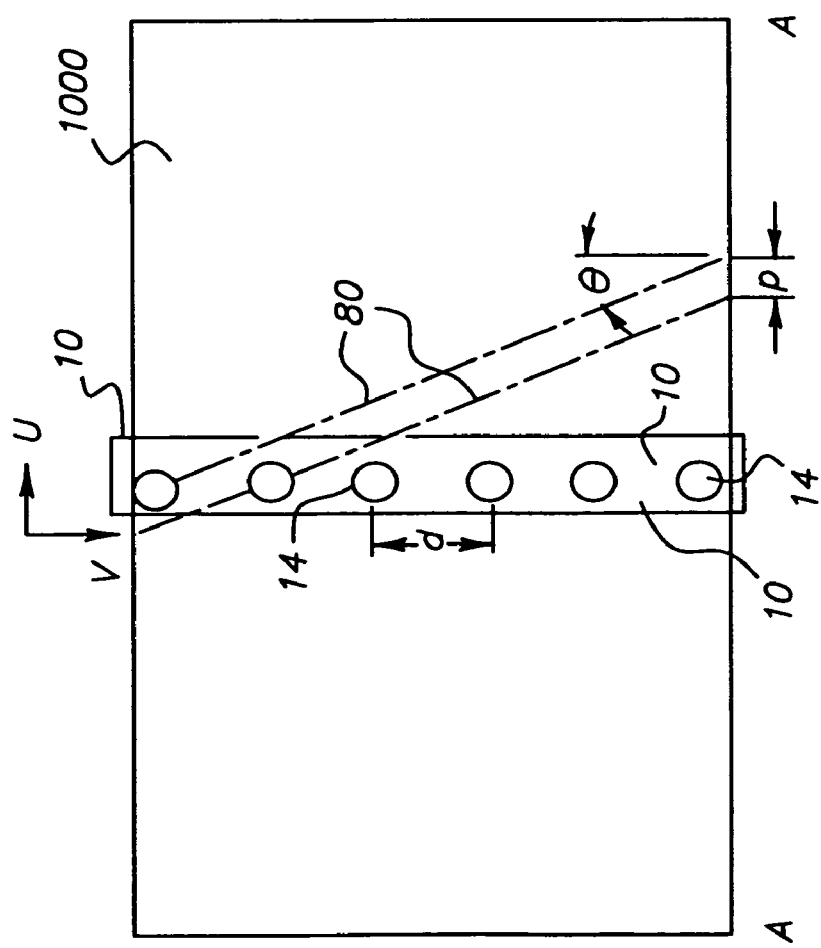

A further feature of the present invention will be described with reference to FIGS. 7A and 7B. FIG. 7A shows a top view of the present invention, where belt 10 is moving downward at a linear velocity of v, and media 1000 is moving right at a linear velocity of u. Lines 80 represent centerlines of a processing band produced by the pressure from two consecutive micro-members 14. Angle θ as shown in FIG. 7A can be adjusted by adjusting a ratio of u to v. For example, line 80 is vertical when the media speed u is zero.

An advantage of the present invention is related to the fact that the whole imaging area is processed under the micro-members 14 multiple times to ensure color development. Furthermore, as shown in FIG. 7A, a pitch p (the distance between the centerlines 80 of two consecutive processing bands), can be adjusted by adjusting the spacing of the micro-members 14, as well as the velocities of the belt 10 and the media 1000. In fact, as illustrated by the following equation (1), it can be shown that $$p = \frac{u}{v} d \quad (1)$$

where p is the pitch, u and v are the belt speed (vertical) and media speed (horizontal to the right), respectively, and d is the distance between the centers of two consecutive micro-members 14. In order to achieve a sufficiently high color density Dmax, the pitch value should be much smaller than a characteristic length (radius in the case of sphere) of the micro-members 14. In the present invention, in order to achieve the desired small pitch value, one simply needs to reduce media speed u, or the distance d between the consecutive micro-features. Of course, the distance d cannot be smaller than the diameter of the sphere, however the media speed u can be reduced to a needed value to achieve the desired pitch.

Figure 8:
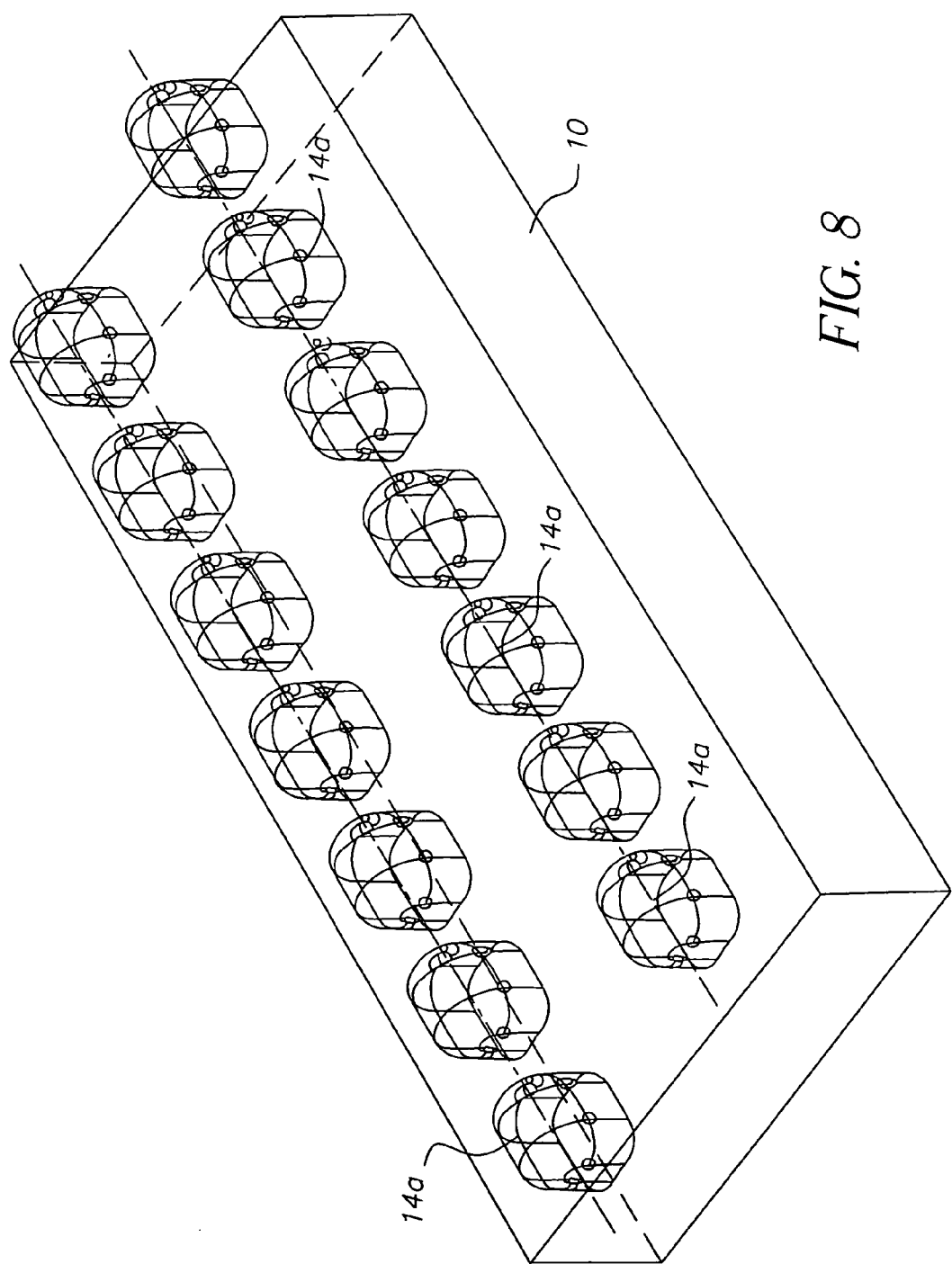
FIG. 8 is a schematic view of the surface of a further embodiment of a belt or belt-type processing member in accordance with the present invention.
Figure 9:
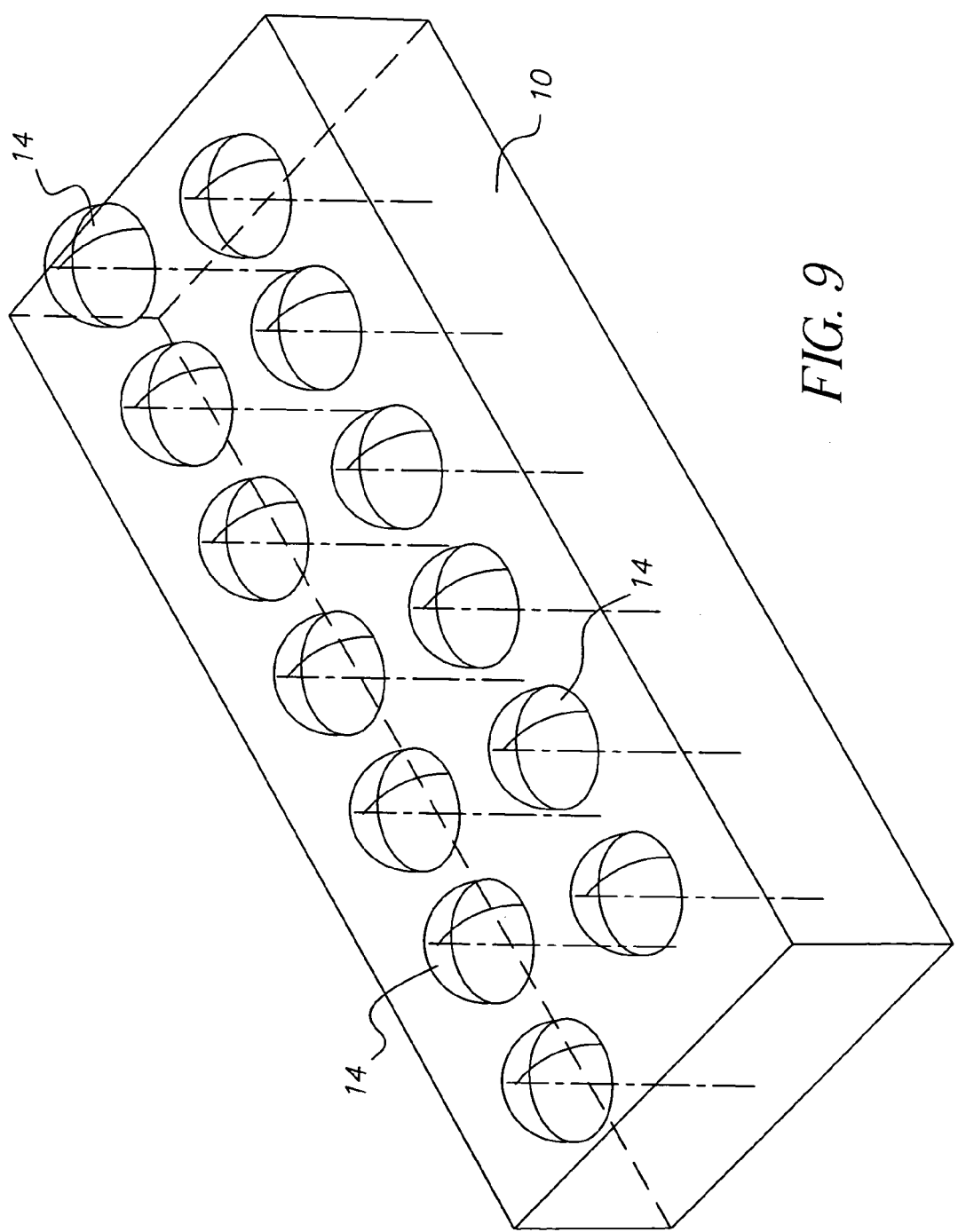
FIG. 9 is a schematic view of the surface of a still further embodiment of a belt or belt-type processing member in accordance with the present invention.

As described above, the micro-members 14 can be in various shapes, can vary in spacing and can vary in configuration. FIG. 7B is a side view or FIG. 7A and show micro-members 14 as a spherical or semi-circular members. Also, as shown in FIG. 7A, the micro-members can be in a single row on belt 10. However, the present member is not limited to such an arrangement. FIGS. 8 and 9 are alternative embodiments of the inventions where two rows of micro-members 14, 14a are shown.

Figure 10:
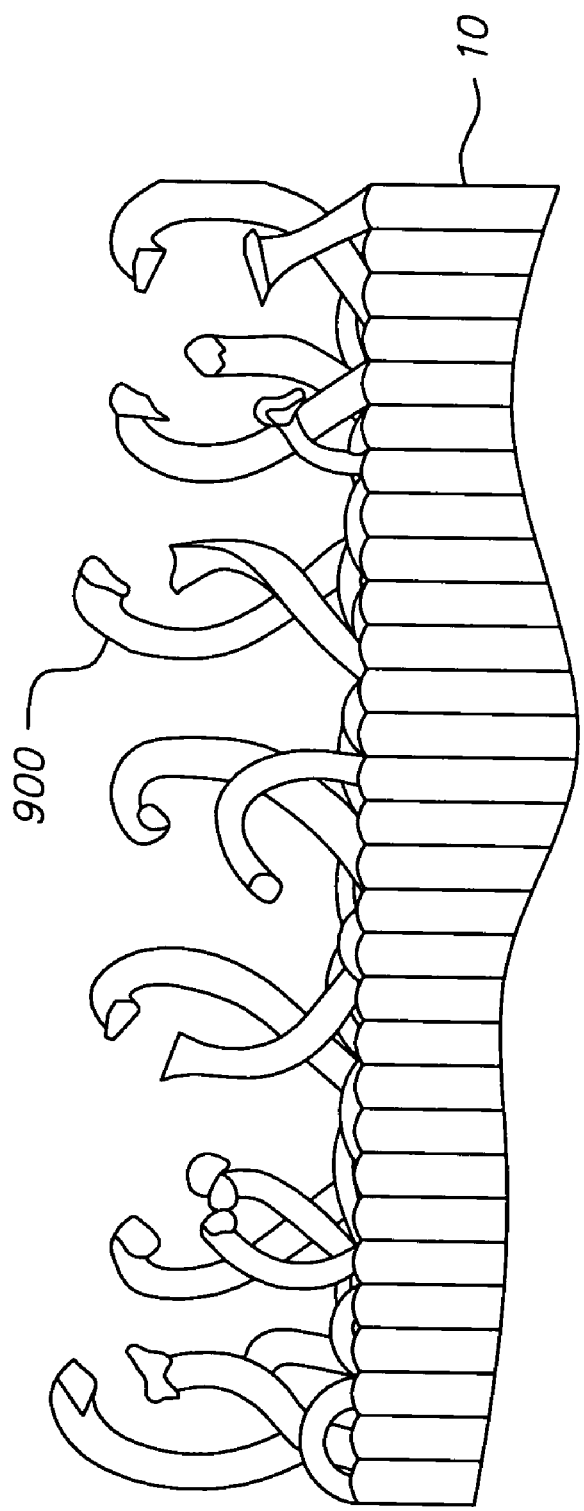
FIG. 10 is a view of the surface of a still further embodiment of a belt or belt-type processing member of the present invention.

Further, instead of a spherical member, micro-members 14, 14a on the surface of belt 10 can be in the form of loop and hooks. FIG. 10 illustrates one embodiment of a loop and hook configuration 900 provided on the surface of belt 10. Although loop and hook configuration 900 is shown as broken loops, the present invention is not limited thereto. As an alternative, the loops of the loop and hook configuration can be unbroken loops. Further, the loops and hooks can be made of a plastic or resilient material and can be provided on the outer surface of belt 10 in a random or predetermined pattern with respect to location and height.

Loop and hook configuration 900 functions like micro-members 14, 14a in that a rotation of belt 10 causes loop and hook configuration 900 to contact the media while being rotated. This causes a force on the media that is sufficient to rupture the non-hardened microcapsules to release coloring material.

It is noted that belt 10 having spherical members 14, 14a, or belt 10 having loop and hook configuration 900 can be compliant in nature in order to compensate for any non-uniform surfaces on the media, and can be self-correcting for media thickness variations. It is also noted that belt 10 can be rotated at various velocities in accordance with design considerations, however, faster velocities provide for a higher probability of more micro-members striking the microcapsules on the media, which improves development.

The arrangement of the present invention is advantageous for processing media such as disclosed in co-pending application U.S. Ser. No. 10/687,939, since a sufficient force to rupture the capsules is created. The present invention also permits the use of a low cost base media since the processing can be restricted to the microcapsules and any deformation or patterning caused by density differences in the support sheet and read out in the development of the media due to the resulting differential pressures is of no consequence. That is, in a feature of the present invention, rotating belt 10 with micro-members 14, 14a or 900 thereon permits the restriction of processing development to the image forming layer of media 1000, while leaving both the top most clear gel comprising layer intact and without scratches. Further, belt 10 with micro-members 14, 14a or 900 thereon does not invade the bottom-most backing layer of media 1000 and thus, avoids pattern readout of low-cost media supports.

The invention has been described in detail with particular reference to certain preferred embodiments thereof, but it will be understood that variations and modifications can be effected within the spirit and scope of the invention.

What is claimed is:

1. An image-forming device comprising:
   an imaging member that exposes a photosensitive medium to form a latent image on the photosensitive medium, the photosensitive medium comprising a plurality of microcapsules which encapsulate imaging material; and
   a processing member that develops the latent image, said processing member comprising a rotatable belt that includes micro-members on a surface thereof which contact the photosensitive medium during a rotation of the belt to apply a force to a surface of the photosensitive medium, said force being sufficient to release imaging material from selected microcapsules of said plurality of microcapsules.

2. An image-forming device according to claim 1, wherein said micro-members are a plurality of spherical members provided on the surface of the belt.

3. An image-forming device according to claim 1, wherein said micro-members are a plurality of hook and loop members which extend from an outer surface of said belt.

4. An image-forming device according to claim 1, further comprising a backing member positioned so as oppose said belt, wherein said media passes between said belt and said backing member.

5. An image-forming device according to claim 4, wherein said backing member is an opposing platen roller.

6. An image-forming device according to claim 1, wherein said belt is an endless belt that extends around two opposing pulleys.

7. An image-forming device according to claim 6, further comprising a spring member that urges a surface of said belt which opposes the media in a direction toward the media.

8. An image-forming device according to claim 6, wherein said belt is rotated in a first direction around the opposing pulleys, said first direction being transverse to a direction of travel of the media in said image-forming device.

9. An image forming method comprising:
exposing a photosensitive medium comprising a plurality of micro-capsules which encapsulate imaging material to form a latent image; and
developing the latent image by contacting a surface of said medium with a rotating belt having micro-members thereon, said contacting of the micro-members of the rotating belt with the surface of the medium applying a force to the surface of the medium which is sufficient to release imaging material from selected microcapsules of the plurality of microcapsules.

10. An image forming method according to claim 9, wherein said micro-members comprise a plurality of hook and loop members located on a surface of said belt.

11. An image forming method according to claim 9, wherein said micro-members comprise a plurality of spherical members located on a surface of said belt.

12. An image forming method according to claim 9, wherein during said developing step, the medium is conveyed between the rotating belt and a backing member.

* * * * *